United States Patent [19]
Lee et al.

[11] Patent Number: 6,103,582
[45] Date of Patent: Aug. 15, 2000

[54] METHOD TO SUPPRESS BORON PENETRATION IN P+ MOSFETS

[75] Inventors: Lurng Shehng Lee; Chung Len Lee, both of Hsinchu, Taiwan

[73] Assignee: Industrial Technology Research Institute, Hsin-Chu, Taiwan

[21] Appl. No.: 09/133,354

[22] Filed: Aug. 13, 1998

[51] Int. Cl.[7] .................................................. H01L 21/336
[52] U.S. Cl. ........................ 438/299; 438/585; 438/532
[58] Field of Search .................................... 438/514, 515, 438/516, 532, 585, 299, 197

[56] References Cited

U.S. PATENT DOCUMENTS

| | | | |
|---|---|---|---|
| 5,393,676 | 2/1995 | Anjum et al. | 437/24 |
| 5,468,974 | 11/1995 | Aronowitz et al. | 257/51 |
| 5,518,943 | 5/1996 | Tsunoda | 437/43 |
| 5,576,228 | 11/1996 | Chen et al. | 437/35 |
| 5,605,848 | 2/1997 | Ngaoaram | 437/24 |

*Primary Examiner*—Tuan H. Nguyen
*Attorney, Agent, or Firm*—George O. Saile; Stephen B. Ackerman

[57] ABSTRACT

With the growing practice of doping gates for MOSFETs with boron, problems have been encountered due to later diffusion of the boron into the active region. To block this, argon ions are implanted into the gate pedestal material prior to doping it with boron. The damage caused by the argon ions results in traps that getter the boron atoms, behaving in effect as a diffusion barrier. The invention is directed specifically to gate pedestals that are less than about 3000 Angstroms thick. Under these conditions it has been determined that the implantation energies of the argon ions should not exceed 80 keV. It is also important that the dosage of argon be in the range from $1 \times 10^{15}$ to $1 \times 10^{16}$ per $cm^2$. Preferably doses in excess of $5 \times 10^{15}$ should be used as they also lead to improvements in subthreshold swing and hot carrier immunity.

14 Claims, 1 Drawing Sheet

METHOD TO SUPPRESS BORON PENETRATION IN P+ MOSFETS

FIELD OF THE INVENTION

The invention relates to the general field of integrated circuit manufacture with particular reference to the manufacture of P+ MOSFETs.

BACKGROUND OF THE INVENTION

To avoid short-channel effects, P+ polysilicon is commonly used as the gate material for surface-channel P-type metal-oxide-semiconductor field-effect transistors (MOSFETs). However, the boron used to dope the polysilicon can penetrate through to the gate oxide and to the underlying silicon. In particular, fluorine atoms, associated with the $BF_2$ ion implantation, enhance boron penetration through the thin gate oxide into the Si substrate. This results in a large threshold voltage shift, high charge trapping rate, degradation of P-channel inverse subthreshold and poor reliability of the devices.

Various techniques have been proposed to suppress the boron penetration. For example, use of an amorphous silicon gate has been suggested since it prevents the channeling effect and its larger grain size suppresses boron diffusion. A stacked gate has also been suggested since it has the ability to getter F atoms at its layer boundaries, thereby retarding boron diffusion.

The approach taken by the present invention has been to utilize argon implantation into the P+ poly-Si gate to suppress the boron diffusion. It is known that Ar-implantation in polysilicon or silicon generates bubble-like defects. These have the property of gettering the fluorine and boron atoms at the damaged regions due to Ar implantated into polysilicon or α-silicon thereby suppressing the boron penetration. The integrity of gate oxide is thus preserved and excellent electrical characteristics for the interface state density ($D_{it}$), dielectric breakdown ($E_{bd}$), and charge-to-break down ($Q_{bd}$) of the gate oxide are obtained.

A general description of the argon implantation method can be found in Anjum et al. (U.S. Pat. No. 5,393,676 February 1995) which describes how a diffusion barrier comprised of implanted argon ions is placed deep within the gate material (which is limited to polysilicon). An argon ion dose between $10^{13}$ and $5 \times 10^{14}$ per cm.$^2$ is specified. Anjum et al. locate their diffusion barrier at a depth of about 4,000 Angstroms, corresponding to an ion implantation energy of about 250 keV. Other references of interest include Aronowitz et al. (U.S. Pat. No. 5,468,974 November 1995) who teach that implanted species can be used to control diffusion of of donors or acceptors. Ngaoaram (U.S. Pat. No. 5,605,848 February 1997) uses nitrogen ions to prevent penetration of impurities into an oxide layer. Tsunoda (U.S. Pat. No. 5,518,943 May 1996) shows a gate process where argon ions are implanted into the substrate while Chen et al. (U.S. Pat. No. 5,576,228 November 1996) shows a method of forming a gate electrode.

SUMMARY OF THE INVENTION

It has been an object of the present invention to provide a process for suppressing the penetration of boron into a gate pedestal, thereby preventing it from reaching the active region.

A further object of the present invention has been to provide said process for gates made of either amorphous silicon or polysilicon.

A still further object of present invention has been that said process be suitable for gates that are less than about 3000 Angstroms thick.

These objects have been achieved by implanting argon ions into the gate pedestal material prior to doping it with boron. The damage caused by the argon ions results in traps that getter the boron atoms, behaving in effect as a diffusion barrier. The invention is directed specifically to gate pedestals that are less than about 3000 Angstroms thick. Under these conditions it has been determined that the implantation energies of the argon ions should not exceed 80 keV. It is also important that the dosage of argon be in the range from $1 \times 10^{15}$ to $1 \times 10^{16}$ per cm$^2$. Preferably doses in excess of $5 \times 10^{15}$ should be used as they also lead to improvements in subthreshold swing and hot carrier immunity.

DESCRIPTION OF THE PREFERRED EMBODIMENTS

Figure 1:
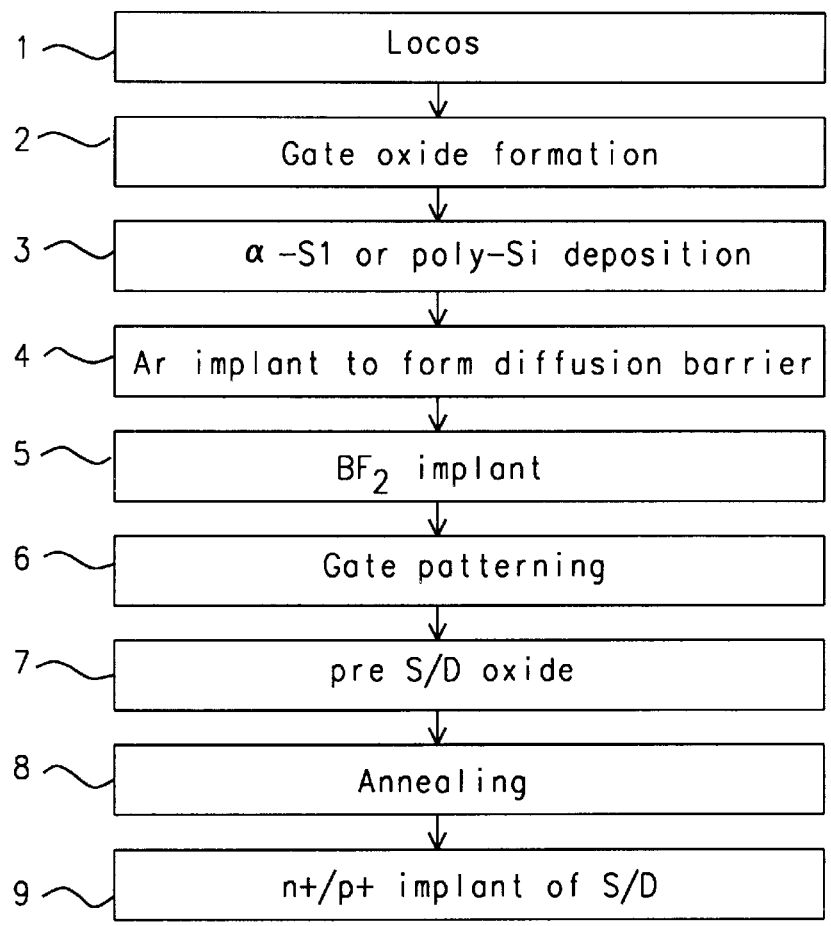
FIG. 1 is a flow chart summarizing the process of the present invention.

As the dimensions of semiconductor devices continue to shrink, the parameters associated with implanting argon ions for the purpose of forming a diffusion barrier change. The present invention is concerned with FET devices having gate widths less than about micron and gate thicknesses less than about 100 Angstroms.

In order to determine what are the critical parameter ranges associated with such small devices, several experiments were performed. P+ polysilicon gate MOS capacitors were fabricated for the purpose of making basic measurements of the characteristics of the gate oxide. In addition, CMOS devices were fabricated having a P+ polysilicon gate. The capacitors were fabricated in the N-well region, which had been implanted with phosphorus at 100 keV on a P-type (100) 15–25 ohm-cm Si wafer. The active region was defined by the conventional LOCOS (local oxidation of silicon) process, following which a thin oxide ($\leq 100$ Angstroms) was grown at temperature between about 800 and 950 ° C., with about 920° C. being preferred, in dry $O_2$ followed by annealing in $N_2$ for about 20 min. About 3,000 Angstroms of LPCVD (low pressure chemical vapor deposition) α-Si was deposited at 560° C. onto the sample to serve as the gate.

Similar devices having polysilicon gates of the same thickness were also made. The samples then received Ar implantation doses of $1 \times 10^{15}$ cm$^{-2}$, $5 \times 10^{15}$ cm$^{-2}$, and $1 \times 10^{16}$ cm$^{-2}$, all at 30 keV. The projected range for the argon ions was about 900 Å which was much shallower than the thickness of the α-Silicon gate. Then, $BF_2$, at a dose of $6 \times 10^{15}$ cm$^{-2}$ was implanted at 50 keV for all samples. After patterning and etching, the gate was thermally reoxidized to grow an additional 90 Angstroms of oxide over the source/drain regions to prevent boron out-diffusion during subsequent annealing processes.

Before the source/drain implantation, the wafers were annealed in a furnace at temperatures of 900° C., 950° C. or 1,000° C. in $N_2$ for 15 min. All the samples received an annealing treatment at 900° C. for 30 min. after BPSG (boron phosphosilicate glass) deposition. Aluminum contacts were made, which were sintered at 410° C. for 30 min. The area of capacitors for breakdown measurement was $0.16 \times 10^{-4}$ cm$^2$. $Q_{bd}$ was measured under a constant stressing current of 100 mA/cm$^2$ where the N-type substrate was biased at accumulation mode.

The physical thickness of the gate oxides as measured by ellipsometry was $93 \mp 2$ Å The effective electrical thicknesses of the gate oxide was derived from C-V curves and are listed in TABLE I below. The applied voltage ($V_g-V_{fb}$) in the accumulation region is 5 Volt at which value the electrical thickness of the gate oxide was measured. They are slightly larger for the samples without Ar-implantation, and the higher the annealing temperature, the larger the oxide thickness. It is also observed that the poly-Si samples had the largest oxide thickness. This can be explained as follows: for the samples with Ar implantation, their gate oxide had a lower fluorine concentration due to gettering of fluorine by the bubble-like defect by Ar implantation; however, for the samples without Ar implantation, their gate oxides had a higher fluorine concentration due to the fluorine diffusion, and the higher the annealing temperature, the severer the fluorine diffusion. The poly-Si samples had the highest fluorine concentration since their gates had the most susceptibility to boron diffusion. The samples which had severer boron penetration, and consequently higher fluorine concentrations in the oxide, exhibited a larger oxide thickness.

TABLE I

Electrical thickness of gate oxides as a function of implanted argon

| Oxide Thickness (Å) | α-Si | | | poly-Si |
|---|---|---|---|---|
| Annealing temperature | 900° C. | 950° C. | 1,000° C. | 900° C. |
| Without Ar implant | 103 | 106.4 | 107 | 110 |
| With Ar implant ($1 \times 10^{15}$/cm$^2$) | 102.8 | 103.9 | 106.7 | — |
| With Ar implant ($5 \times 10^{15}$/cm$^2$) | 101.9 | 103.1 | 104.3 | 106 |
| With Ar implant ($1 \times 10^{16}$/cm$^2$) | 101.5 | 101.7 | 102.8 | 103 |

Micrographs obtained through TEM (transmission electron microscopy) show that the α-Si gate samples have larger grain sizes than those of the poly-Si gate samples but for both groups of samples, the grain sizes of the Ar-implanted samples are the same as that of the samples without Ar-implantation. However, it is observed that there are bubble-like defects on the α-Si gate samples and the more the Ar-implantation, the more the defects. The sample without Ar-implantation had the lowest bubble density, about $4 \times 10^{10}$ cm$^-$, but it had the largest bubble size, between about 80 and 600 Å. The Ar-implanted sample with a dose of $1 \times 10^{16}$ cm$^{-2}$, had the largest density, about $7 \times 10^{11}$ cm$^{-2}$, but the smallest bubble size, between about 30 and 300 Å. For the poly-Si gate samples, no bubble was observed for the sample without Ar ion-implantation, and for the Ar-implanted samples, bubbles were observed but with less densities than the corresponding counterparts of the α-Si gate samples of the same doses.

TABLE II summarizes the bubble size/density in terms of the Ar implantation dose for both α-Si gate and poly-Si gate samples. The table shows that these bubble-like defects correlate with the suppression capability of samples. It is believed that these bubble-like defects behaved like gettering centers for the implanted fluorine, which in turn resulted in suppression of boron diffusion. The more the implanted Ar, the more the bubble defects, and the more the suppression effect.

TABLE II

Correlation between bubble density/size and Ar implant dose

| | Ar implant dose (cm$^{-2}$) | 0 | $1 \times 10^{15}$ | $5 \times 10^{15}$ | $1 \times 10^{16}$ |
|---|---|---|---|---|---|
| α-Si | Bubble density (cm$^{-2}$) | $4 \times 10^{10}$ | $2.7 \times 10^{11}$ | $4.7 \times 10^{11}$ | $7 \times 10^{11}$ |
| | Bubble size (Å) | 80–600 | 30–400 | 30–400 | 30–300 |
| poly-Si | Bubble density (cm$^{-2}$) | none | $2.1 \times 10^{11}$ | $3.4 \times 10^{11}$ | $5.2 \times 10^{11}$ |
| | Bubble size (Å) | none | 25–125 | 25–125 | 25–125 |

To investigate the phenomenon that Ar-implanted samples annealed at 1,000 C did not show much boron suppression effect, TEM pictures for these samples were also taken. These reveal bubbles of larger size but lower density than those of the sample annealed at 900° C. This larger bubble size but lower density was the result of the poly grain regrowth at the higher temperature of 1,000° C. The 1,000° C.-annealed sample had grains of larger size than that of the 900° C.-annealed sample. This larger size but lower density bubbles explains the decreased boron suppression ability for the sample annealed at 1,000° C. At the same time, the larger grains of the α-Si gate also resulted in larger stress on the gate oxide. This in addition degraded the oxide characteristics like $Q_{bd}$, $E_{bd}$, and $D_{it}$.

A plot of threshold voltage shifts shows that the more the Ar-implantation, the more negative the $Vt_{th}$ and the less the short channel effect are observed. For Ar-implanted devices having doses above $5 \times 10^{15}$ cm$^{-2}$, their $V_{th}$ even becomes negative for channel lengths less than $1\mu$. Since, the boron penetration reduces the channel doping, making the short channel effect more significant, this strongly indicates that Ar-implantation reduces the boron diffusion in the gates of the devices.

The more Ar-implantation, the better the off- and the sub-threshold characteristics of the devices, the devices without Ar-implantation having the poorest characteristics. For example, for the devices without the Ar-implant, the sub-threshold swing is 112 mv/dec. whereas for the implanted devices (dose of $1 \times 10^{16}$ cm$^{-2}$, it is reduced to 96 mv/dec. This is because the increase in the number of unannealed-out interface states and the presence of more acceptor type charges in the underlying channel due to boron penetration diffusion, resulted in more subthreshold swings. For the samples with Ar implantation, the above effects become less serious.

Hot carrier effects of the same samples, for which their threshold voltage shifts were plotted against their stressing gate voltage ($V_g-V_{th}$) were also examined. During stressing, the samples were biased at a drain voltage of $V_d=-6V$. for 10 min. For a fixed drain voltage, if the gate stressing voltage varies from 5V to −5V, the gate current increases first and then decreases due to the fact that the drain-gate field increases and then decreases, so the stressing gate voltage for each sample was chosen to be the value which gave the maximum gate current in order to obtain the maximum stressing. These gate voltages and maximum gate current for various Ar implant dose are listed in TABLE III.

TABLE III

Maximum gate current
and its gate voltage for various Ar implant doses

| Ar implant dose (cm$^{-2}$) | 0 | 1 × 10$^{15}$ | 5 × 10$^{15}$ | 1 × 10$^{16}$ |
|---|---|---|---|---|
| Maximum gate current, I$_g$(nA) | 4.45 | 3.41 | 3.12 | 2.78 |
| Gate voltage for maximum I$_g$ | −0.1 | −0.21 | −0.35 | −0.48 |

Note that the maximum V$_{th}$ shift for the sample without Ar implantation was approximately 140 mV, but was only 82 mV for the sample having an Ar-implant dose of 10$^{16}$ cm$^{-2}$. This again shows that the Ar-implantation improves the hot carrier susceptibility of PMOSFETs. This result is easily explained since the Ar-implanted devices have an improved gate oxide quality as compared to that of the devices without Ar-implantation. This confirms that device performance characteristics such as the subthreshold swing and the hot carrier immunity were improved by the Ar implantation, with the best improvement being obtained at doses above 5×10$^{15}$ cm$^{-2}$.

The process of the present invention has been summarized in the FIG. 1. The process begins with step 1 which is local oxidation (LOCOS), for the purpose of forming regions of field oxide to isolate individual devices. In step 2 a layer of gate oxide is formed by heating the silicon wafer in dry oxygen at a temperature between about 800 and 950° C. for between about 5 and 30 minutes. The resulting layer of oxide is less than 100 Angstroms thick.

Next, material for the gate pedestal is deposited. This may be amorphous silicon (α-silicon) or polysilicon. Deposition of the amorphous silicon is achieved by means of LPCVD (between about 180 and 230 mtorr pressure), using a silane gas source at about 560° C. and a deposition rate of about 50 Å/min. Deposition of the polysilicon was also achieved in a silane LPCVD source in the same pressure range but at a higher deposition temperature (about 620° C.) and rate (about 100 Å/min. In either case, the thickness of this layer was generally kept to at most 3000 Angstroms, although any thickness between about 1,500 and 4,500 Angstroms would still be acceptable.

In a key feature of the invention, step 4 is now implemented. The layer of alpha silicon or polysilicon is ion implanted with argon ions to a depth between about 500 and 900 Angstroms. This is achieved by using an ion energy between about 50 and 80 keV at a dose between about 10$^{15}$ and 10$^{16}$ ions per cm$^2$ with a dose of 5×10$^{15}$ per cm$^2$ being preferred.

Doping of the gate material with boron is performed next in step 5. Boron ions are implanted at an energy between about 30 and 80 keV, with about 50 keV being preferred. The dose of implanted ions of boron is between about 2×10$^{15}$ and 1×10$^{16}$ per cm$^2$ with about 6×10$^{15}$ being preferred.

In step 6, photoresist and etching are used to pattern the silicon layer into the shape of the gate pedestal. Step 7 follows with the growing of a thin layer of oxide over the top surface of the gate pedestal for the purpose, as discussed earlier, of preventing out diffusion of boron later on. This additional oxide layer is grown at between about 800 and 850° C. for between about 20 and 30 minutes, resulting in an oxide layer that is between about 85 and 95 Angstroms thick.

Step 8 is an annealing step whose purpose, as discussed above is to activate and drive in the BF$_2$ dopant. It is implemented by heating between about 900 and 950° C. for between about 10 and 20 minutes in an atmosphere of nitrogen.

Figure 2:
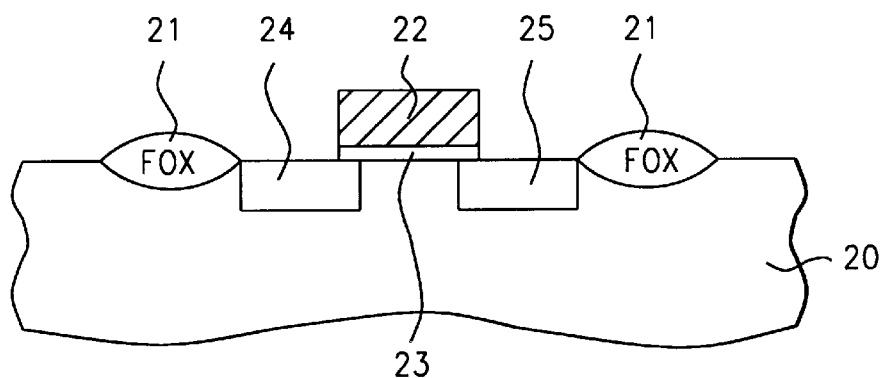
FIG. 2 shows the structure that is obtained at the completion of the process of the sent invention.

Finally, step 9 is implemented. This is the formation of the source and drain regions which are positioned on opposing sides of the gate pedestal. These areas are formed through ion implantation of either acceptor or donor species, depending on the type of device that is to be formed. FIG. 2 is a schematic representation of the structure that is obtained at the completion of the above-described process. Shown is silicon body 20 having LOCOS, or field oxide areas, 21 between which is located gate pedestal 22 with gate oxide layer 23 located immediately below it. Source and drain regions 24 and 25 are on opposing sides of pedestal 22. Although many steps still remain to complete the manufacture of the entire integrated circuit, the process of present invention ends at this point.

While the invention has been particularly shown and described with reference to the preferred embodiments thereof, it will be understood by those skilled in the art that various changes in form and details may be made without departing from the spirit and scope of the invention.

What is claimed is:

1. A process to suppress boron penetration of a gate pedestal during the manufacture of an integrated circuit, comprising:

providing a body of silicon;

forming regions of field oxide by means of a LOCOS process;

forming a layer of gate oxide on said silicon body;

depositing a layer of amorphous silicon onto said layer of gate oxide;

implanting argon ions, having energies between about 50 and 80 keV at a dose between about 5×10$^{15}$ and 10$^{16}$ ions per cm$^2$, into said layer of amorphous silicon, making it an implanted layer;

implanting boron ions into said implanted layer of amorphous silicon;

patterning and etching said layer of amorphous silicon to form a gate pedestal;

forming a protective layer of silicon oxide on said gate pedestal;

annealing the silicon body; and forming source and drain regions on opposing sides of said gate pedestal by means of implanted ions thereby forming a field effect device.

2. The process of claim 1 wherein said layer of gate oxide is formed by heating the silicon wafer in dry oxygen at a temperature between about 800 and 950° C. for between about 5 and 30 minutes.

3. The process of claim 1 wherein depositing the amorphous silicon further comprises using LPCVD, at between about 180 and 230 mtorr pressure, with a silane gas source at about 560° C. and a deposition rate of about 50 Å/min.

4. The process of claim 1 wherein said layer of amorphous silicon is implanted with argon ions to a depth between about 500 and 900 Angstroms.

5. The process of claim 1 wherein said protective silicon oxide layer is grown at between about 800 and 850° C. for between about 20 and 30 minutes, resulting in a thickness between about 85 and 95 Angstroms.

6. The process of claim 1 wherein said dose of argon ions is about 5×10$^{15}$ cm$^{-2}$ whereby subthreshold swing of the device is improved.

7. The process of claim 1 wherein said dose of argon ions is about 5×10$^{15}$ cm$^{-2}$ whereby hot carrier immunity of the device is improved.

8. A process to suppress boron penetration of a gate pedestal during the manufacture of an integrated circuit, comprising:

providing a body of silicon;

forming regions of field oxide by means of a LOCOS process;

forming a layer of gate oxide on said silicon body;

depositing a layer of polysilicon onto said layer of gate oxide;

implanting argon ions, having energies between about 50 and 80 keV at a dose between about $5 \times 10^5$ and $10^{16}$ ions per cm$^2$, into said layer of polysilicon, making it an implanted layer;

implanting boron ions into said implanted layer of polysilicon;

patterning and etching said layer of polysilicon to form a gate pedestal;

forming a protective layer of silicon oxide on said gate pedestal;

annealing the silicon body; and forming source and drain regions on opposing sides of said gate pedestal by means of implanted ions thereby forming a field effect device.

9. The process of claim 8 wherein said layer of gate oxide is formed by heating the silicon wafer in dry oxygen at a temperature between about 800 and 950° C. for between about 5 and 30 minutes.

10. The process of claim 8 wherein depositing the polysilicon further comprises using a silane LPCVD source, at between about 180 and 230 mtorr pressure, at a deposition temperature of about 620° C., and a deposition rate of about 100 Å/min.

11. The process of claim 8 wherein said layer of polysilicon is implanted with argon ions to a depth between about 500 and 900 Angstroms.

12. The process of claim 8 wherein said protective silicon oxide layer is grown at between about 800 and 850° C. for between about 20 and 30 minutes, resulting in a thickness between about 85 and 95 Angstroms.

13. The process of claim 8 wherein said dose of argon ions is above $5 \times 10^{15}$ cm$^{-2}$ whereby subthreshold swing of the device is improved.

14. The process of claim 8 wherein said dose of argon ions is above $5 \times 10^{15}$ cm$^{-2}$ whereby hot carrier immunity of the device is improved.

* * * * *